US012567807B2

(12) United States Patent
Kaligonahalli Thippeswamy et al.

(10) Patent No.: US 12,567,807 B2
(45) Date of Patent: Mar. 3, 2026

(54) ACOUSTIC NOISE SUPPRESSION IN PFM BASED BUCK REGULATOR

(71) Applicant: Cypress Semiconductor Corporation, San Jose, CA (US)

(72) Inventors: Yeshwanth Kaligonahalli Thippeswamy, Bangalore (IN); Ravi Theja Konduru, Nellore (IN); Hemant Vispute, Bangalore (IN)

(73) Assignee: Infineon Technologies Americas Corp., El Segundo, CA (US)

( * ) Notice: Subject to any disclaimer, the term of this patent is extended or adjusted under 35 U.S.C. 154(b) by 259 days.

(21) Appl. No.: 18/545,734

(22) Filed: Dec. 19, 2023

(65) Prior Publication Data

US 2025/0202360 A1 Jun. 19, 2025

(51) Int. Cl.
| | |
|---|---|
| *H02M 3/158* | (2006.01) |
| *H02M 1/00* | (2006.01) |
| *H03K 5/04* | (2006.01) |
| *H03K 7/06* | (2006.01) |

(52) U.S. Cl.
CPC ......... *H02M 3/158* (2013.01); *H02M 1/0022* (2021.05); *H03K 5/04* (2013.01); *H03K 7/06* (2013.01)

(58) Field of Classification Search
CPC ...... H02M 3/158; H02M 1/0022; H03K 5/04; H03K 7/06
See application file for complete search history.

(56) References Cited

U.S. PATENT DOCUMENTS

| | | | | |
|---|---|---|---|---|
| 10,224,800 B2 * | 3/2019 | Lu | .......................... | H02M 3/158 |
| 12,081,119 B2 * | 9/2024 | Liu | ...................... | H02M 1/0003 |
| 2007/0096709 A1 * | 5/2007 | Brown | ................ | H02M 3/1588 |
| | | | | 323/283 |
| 2015/0028924 A1 * | 1/2015 | Chao | ........................ | H03K 4/90 |
| | | | | 327/133 |
| 2021/0203223 A1 * | 7/2021 | Chang | .................. | H02M 3/1586 |
| 2022/0190720 A1 * | 6/2022 | Park | ....................... | H02M 3/158 |
| 2022/0200456 A1 * | 6/2022 | Chen | ..................... | H02M 3/158 |
| 2023/0170798 A1 * | 6/2023 | Sareen | .................. | H02M 3/158 |
| | | | | 323/283 |

OTHER PUBLICATIONS

George E Matthew, et al., "Low power all digital acoustic noise suppression technique for switching voltage regulators", Intel Corporation, 2015, 6 pages.
"UCC28880, UCC28881 Audible Noise Reduction Techniques", Texas Instruments Incorporated, Mar. 2017, 7 pages.
"High Efficiency, 65V 500mA Synchronous Step-Down Converter", Linear Technology Corporation, 2012, 26 pages.

* cited by examiner

*Primary Examiner* — Rafael O De Leon Domenech

(57) ABSTRACT

The present disclosure provides an approach that determines a pulse frequency modulation (PFM) period of a buck regulator. The PFM period comprises a first charging stage and a first discharging stage, and wherein the buck regulator switches from the first discharging stage to the first charging stage based on comparing a feedback voltage to a low threshold voltage. The approach generates a pseudo random pulse at a pseudo random period, wherein the pseudo random period is independent from the low threshold voltage. Then, the approach initiates a transition from a second discharging stage to a second charging stage based on the pseudo random pulse.

22 Claims, 8 Drawing Sheets

300 ➤

500

ACOUSTIC NOISE SUPPRESSION IN PFM BASED BUCK REGULATOR

TECHNICAL FIELD

Aspects of the present disclosure relate to power converters, and more particularly, to acoustic noise suppression in a pulse frequency modulation (PFM) buck regulator.

BACKGROUND

A buck regulator is a type of direct current-to-direct current (DC-to-DC) power converter that is designed to provide a lower voltage output from a higher voltage input. A buck regulator manages the energy transfer from input to output, making it a useful component in many electronic devices that utilize stable and reduced voltage levels.

The operation of a PFM buck regulator involves two primary stages, which are a charging stage and a discharging stage. During the charging stage, also referred to as the 'on' stage, a control switch within the buck regulator is turned on. This allows the input voltage to charge the output capacitor. During the discharging stage, also referred to as the 'off' stage, the switch is turned off and the voltage on the output capacitor is discharged through the load.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

As discussed above, a buck regulator uses a charging stage and discharging stage to regulate output power to a load. There are several types of buck regulators, one of which is a Pulse Frequency Modulation (PFM) buck regulator. A PFM period, also referred to as a PFM cycle, is one complete cycle of operation in a PFM buck regulator from the start of the charging stage to the end of the discharging stage measured in units of time (e.g., microseconds). A PFM frequency is the inverse of the PFM period and refers to how often the cycles of charging and discharging occur (frequency of operations) measured in frequency (e.g., Hertz). For example, a PFM period of 50 microseconds equates to a PFM frequency of 20 KHz.

A PFM buck regulator uses reference voltages to set an upper and lower limit for a hysteresis window to control the switching cycle and output voltage regulation. The hysteresis window represents a voltage range corresponding to the desired output voltage. When the buck regulator feedback voltage (e.g., a ratio of the output voltage) hits the upper limit of the hysteresis window, the buck regulator turns off its switching transistor, initiating the discharge stage and causing the output voltage to decrease. Then, when the feedback voltage falls to the lower limit of the hysteresis window, the regulator turns on the switching transistor, commencing the charging stage, and causes the output voltage to increase. The time taken during the discharge state is inversely proportional to the load current. If the load current is higher, the discharge time taken is lower and vice versa.

A challenge found with PFM buck regulators is when the load drops to a level that causes the PFM period to fall into a frequency of operations within an audible frequency range, such as causing the PFM frequency to be between 20 Hz to 20 kHz. When the PFM buck regulator operates within the audible frequency range, the buck regulator can produce fundamental frequency peaks and harmonics that cause mechanical vibrations of components (e.g., inductor, capacitor, connectors, etc.) to produce audible sound. In addition, the abrupt on-and-off switching of the regulator also generates harmonics, which are frequencies that are integer multiples of the fundamental frequency. Both the fundamental frequency and these harmonics contribute to the overall audible noise of the buck regulator. For example, if the PFM period of the buck regulator is 333.3 microseconds, then the PFM frequency is 3 kHz. As such, the buck regulator produces audible noise at 3 kHz, 6 kHz, 9 kHz, etc. (see FIG. 4A and corresponding text for further details).

Figures 4A, 4B:
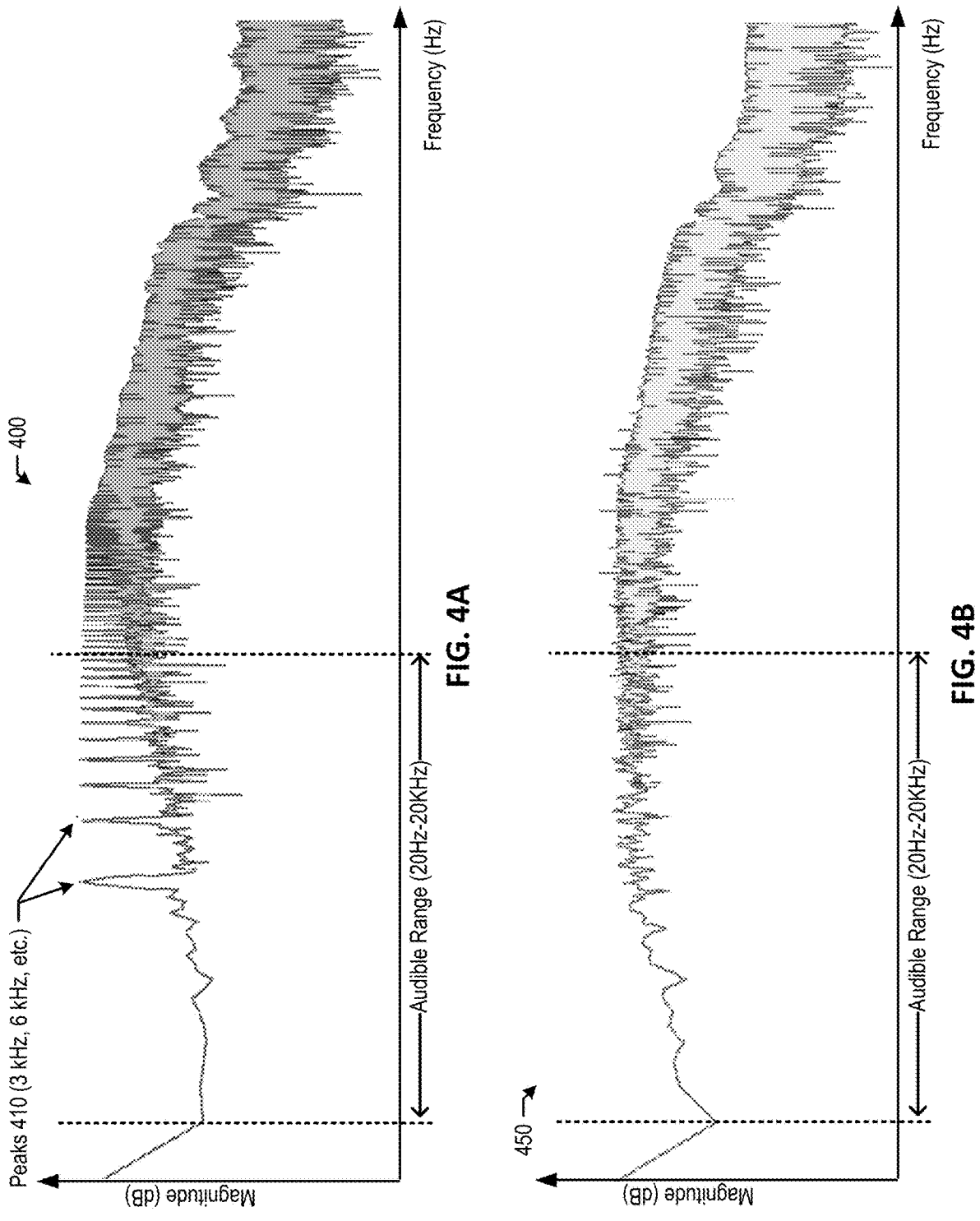
FIG. 4A is a diagram illustrating system 100 operating with a PFM frequency in the audible frequency range when controller 160 disables pseudo random pulse generation, in accordance with some embodiments of the present disclosure.
FIG. 4B is a diagram illustrating system 100 operating with a PFM frequency in the audible frequency range when controller 160 enables pseudo random pulse generation, in accordance with some embodiments of the present disclosure.

The present disclosure addresses the above-noted and other deficiencies by providing an approach to pseudo randomly vary the PFM period that, in turn, attenuates and equalizes the PFM frequency peaks and its harmonic frequencies to form a "white noise," thereby removing audible sound from the buck regulator (see FIG. 4B and corresponding text for further details).

In some embodiments, the approach determines a pulse frequency modulation (PFM) period of a buck regulator that includes a first charging stage and a first discharging stage. The buck regulator switches from the first discharging stage to the first charging stage based on comparing a feedback voltage to a low threshold voltage. The approach generates a pseudo random pulse at a pseudo random period that is independent from the low threshold voltage. Then, the approach initiates a transition from a second discharging stage to a second charging stage based on the pseudo random pulse. In some embodiments, the approach generates the pseudo random pulse in response to determining that the PFM period corresponds to a PFM frequency within an audible frequency range.

In some embodiments, the approach captures multiple PFM periods of the buck regulator and computes an average PFM period based on the multiple PFM periods. The approach generates a pseudo random number, and then computes the pseudo random period based on the pseudo random number and the average PFM period. In some embodiments, the buck regulator switches from the second discharging stage to the second charging stage prior to the feedback voltage reaching the low threshold voltage.

In some embodiments, the approach provides the pseudo random pulse to a first input of OR logic, which produces an OR logic output that selects a high threshold voltage as an input to a comparator. The comparator compares the high threshold voltage to the feedback voltage and produces a comparator output that initiates the transition from the second discharging stage to the second charging stage based on comparing the high threshold voltage to the feedback voltage.

In some embodiments, the comparator output feeds to a second input of the OR logic. The OR logic output then selects the low threshold voltage as the input to the comparator when the feedback voltage reaches the high threshold voltage.

In some embodiments, the approach generates a new pseudo random number and computes a new pseudo random period based on the new pseudo random number and the average PFM period. The approach then generates a new pseudo random pulse based on the new pseudo random period, which is at a different time duration than the previous pseudo random period. The approach then initiates a new transition from a third discharging stage to a third charging stage based on the new pseudo random pulse.

As discussed herein, the present disclosure provides an approach that improves the operation of a computer system by attenuating PFM frequency peaks and reducing overall noise of the computer system. In addition, the present disclosure provides an improvement to the technological field of buck regulator power converters by pseudo randomly modifying the frequency of operations instead of shifting the frequency of operations to a higher frequency.

Figure 1:
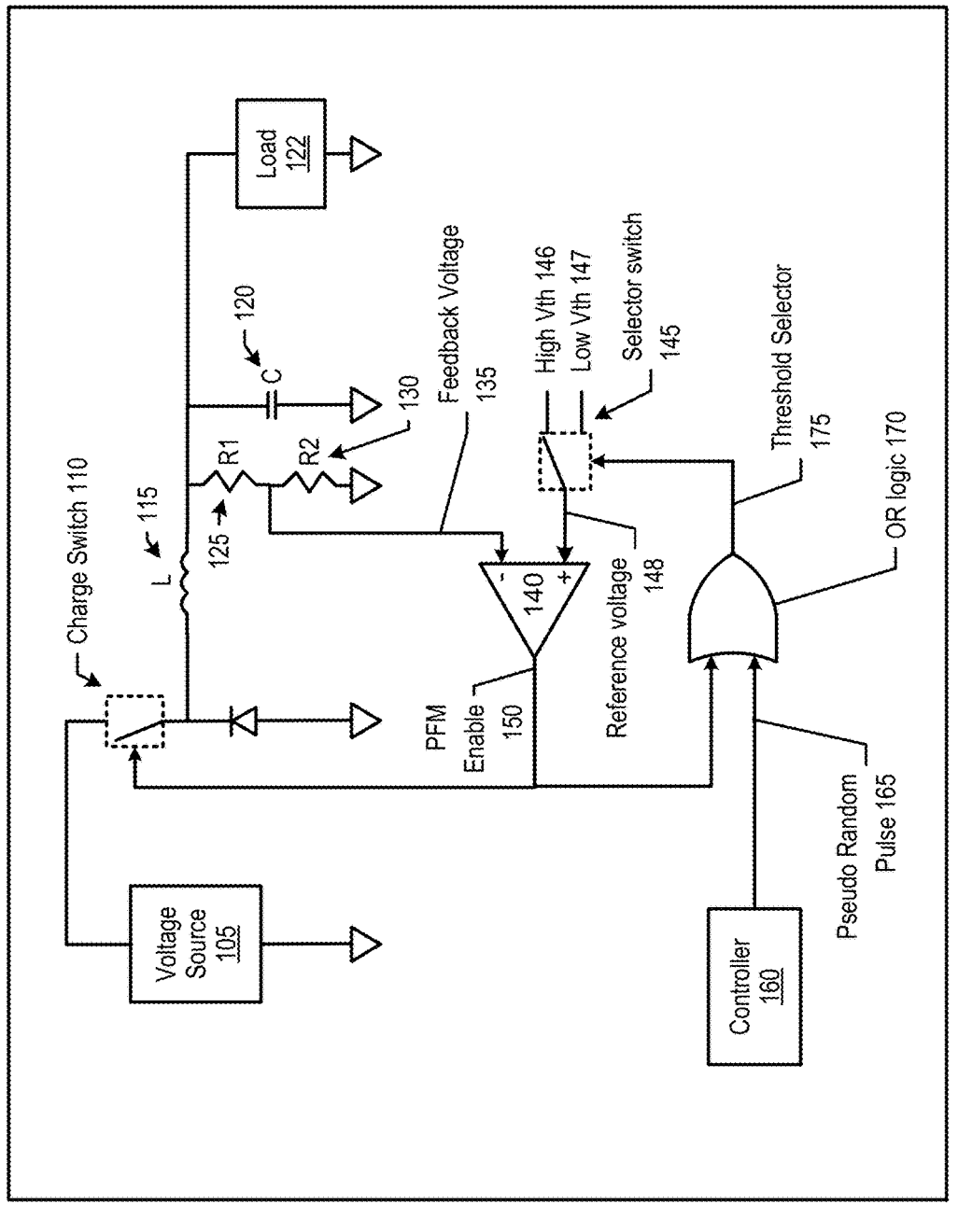
FIG. 1 is a schematic diagram that illustrates an example system for pseudo randomly varying the PFM frequency of a buck regulator, in accordance with some embodiments of the present disclosure.

FIG. 1 is a schematic diagram that illustrates an example system for pseudo randomly varying the PFM frequency of a buck regulator, in accordance with some embodiments of the present disclosure.

System 100 includes buck regulator circuitry and control logic that generates a pseudorandom pulse for triggering the buck regulator circuit to transition from a discharging cycle to a charging cycle prior to the feedback voltage reaching a low threshold voltage. Voltage source 105 provides an input voltage to charge switch 110. Charge switch 110 controls when system 100 enters the charging stage (e.g., closed or on) or discharging stage (e.g., open or off) and is controlled by PFM enable 150. When charge switch 110 is in the charging stage "on" position, voltage source 105 induces a current through inductor 115 and charges the output capacitor 120. When charge switch 110 is in the discharging stage "off" position, the energy stored in the output capacitor 120 is discharged through the load 122. When PFM enable 150 is high, charge switch 110 is in the charging stage "on"

position. When PFM enable is low, charge switch 110 is in the discharging stage "off" position.

Comparator 140 sets the state of PFM enable 150 based on comparing feedback voltage 135 with reference voltage 148. Resistors 125 and 130 form a divider network that produces feedback voltage 135, which is a ratio of the output voltage provided to load 122. Selector switch 145 selects either high threshold voltage 146 or low threshold voltage 147 based on threshold selector 175. When threshold selector 175 is high, selector switch 145 selects high threshold voltage 146 as reference voltage 148. When threshold selector 175 is low, selector switch 145 selects low threshold voltage 147 as reference voltage 148.

When system 100 turns on (e.g., at start-up), feedback voltage 135 is low. Comparator 140 turns PFM enable 150 to a high state because the positive terminal (reference voltage 148) is higher than the negative terminal (feedback voltage 135). A high PFM enable 150 turns charge switch 110 to the charging stage "on" position and begins to charge output capacitor 120. In addition, PFM enable feeds into OR logic 170 and turns threshold selector 175 to a high state to keep selector switch 145 at the high threshold voltage 146 selection.

PFM enable 150 stays high until feedback voltage 135 reaches reference voltage 148 (high threshold voltage 146), at which point PFM enable 150 turns low and switches charge switch 110 to the discharging stage "off" position. In addition, the low PFM enable 150 causes threshold selector 175 to a low state (when pseudo random pulse 165 is low) and selector switch 145 selects low threshold voltage 147 as reference voltage 148. At this point in the discharging stage, comparator 140 keeps PFM enable 150 low because feedback voltage 135 is higher than reference voltage 148 (low threshold voltage 147). When feedback voltage 135 decreases to reference voltage 148, comparator 140 turns PFM enable 150 high, completing a PFM period, and a new charging stage begins.

To pseudo randomly vary the PFM period that, in turn, spreads the PFM frequency and attenuates the fundamental peak frequencies and its other harmonic frequencies to form a "white noise," system 100 uses controller 160 to inject pseudo random pulse 165 into OR logic 170. Controller 160 generates pseudo random pulse 165 based on various factors, for example, when the PFM frequency is within an audible frequency range (see FIG. 5 and corresponding text for further details). When pseudo random pulse 165 turns high when PFM enable is low (discharging stage), OR logic 170 turns threshold selector 175 high and causes selector switch 145 to select high threshold voltage 146 as reference voltage 148. At this point, reference voltage 148 is higher than feedback voltage 135 and triggers comparator 140 to turn PFM enable 150 high. The high PFM enable 150 cause charge switch 110 to the charging stage "on" position and keeps threshold selector 175 high even when pseudo random pulse 165 turns low (see FIG. 2, and corresponding text for further details). The premature switch from discharging stage to discharging stage changes the PFM period and, in turn, spreads the PFM frequency (see FIGS. 3, 4, and corresponding text for further details).

Figure 2:
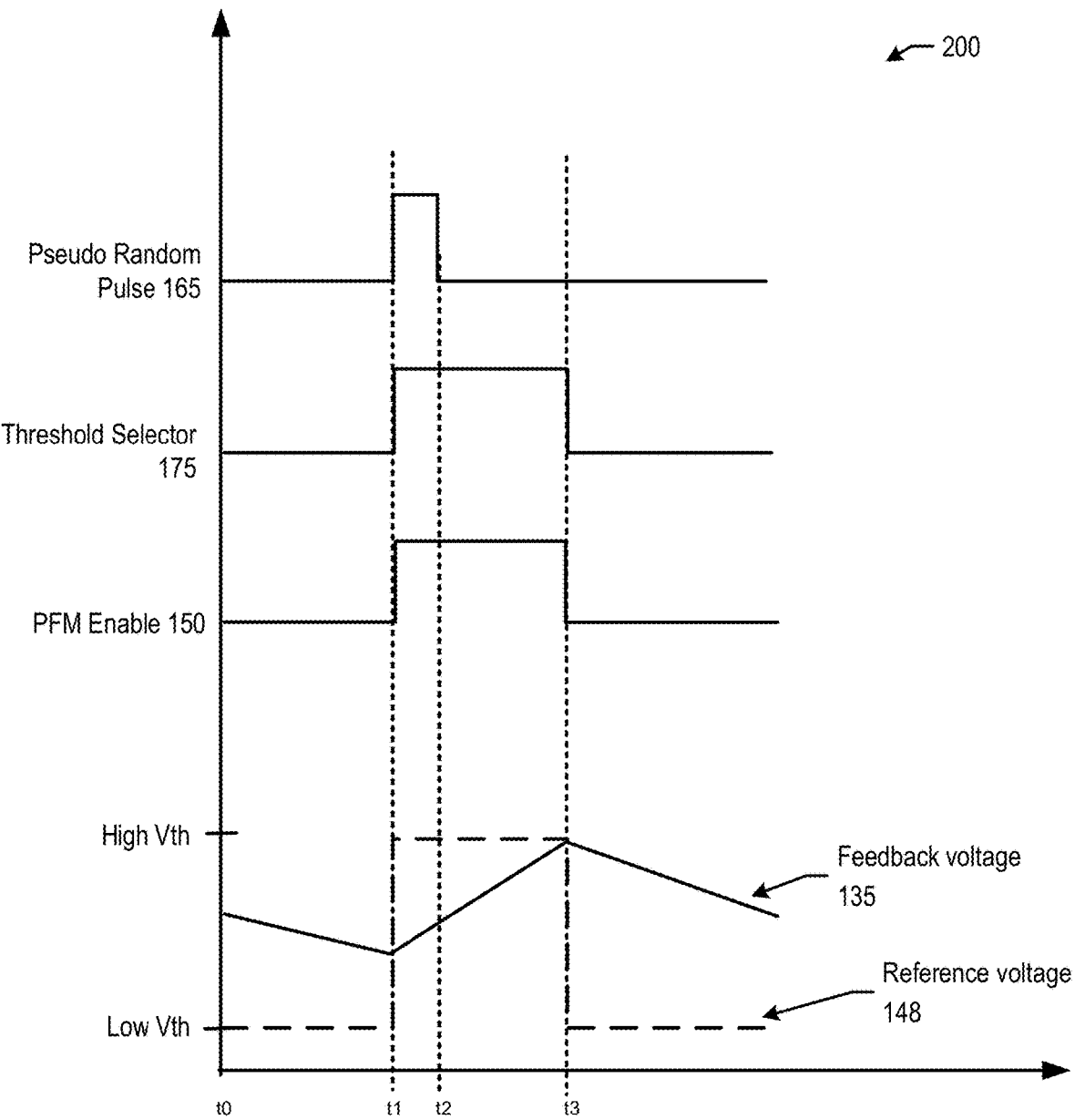
FIG. 2 is a diagram illustrating a pseudo random pulse that triggers a buck regulator to transition from a discharging stage to a charging stage, in accordance with some embodiments of the present disclosure.

FIG. 2 is a diagram illustrating a pseudo random pulse that triggers a buck regulator to transition from a discharging stage to a charging stage, in accordance with some embodiments of the present disclosure. At time t0, pseudo random pulse 165 and PFM enable 150 are low (discharging stage), which causes threshold selector 175 to be low. As such, selector switch 145 selects low threshold voltage 147 as reference voltage 148 and PFM enable 150 stays low because feedback voltage 135 is higher than reference voltage 148.

At time t1, controller 160 generates pseudo random pulse 165, which turns threshold selector 175 high and causes selector switch 145 to switch reference voltage 148 to the high threshold voltage 146. At this point, because reference voltage 148 is now higher than feedback voltage 135, comparator 140 turns PFM enable 150 high and the buck regulator begins a new charging stage. As can be seen at time t2, although pseudo random pulse 165 turns low, PFM enable 150 stays high until feedback voltage 135 reaches reference voltage 148 at time t3, at which point PFM enable 150 turns low and causes threshold selector 175 to turn low, thereby switching charge switch 110 to the discharging stage "off" position.

Referring back to time t1, the buck regulator transitions from the discharging stage to the charging stage before feedback voltage 135 reaches low threshold voltage 147 (normal PFM period) based on when controller 160 generates pseudo random pulse 165. When controller 160 pseudo randomly varies the times at which pseudo random pulse 165 is generated, controller 160 effectively varies the PFM period and spreads the frequency of operations of system 100 (see FIGS. 3, 4A, 4B, and corresponding text for further details).

Figure 3:
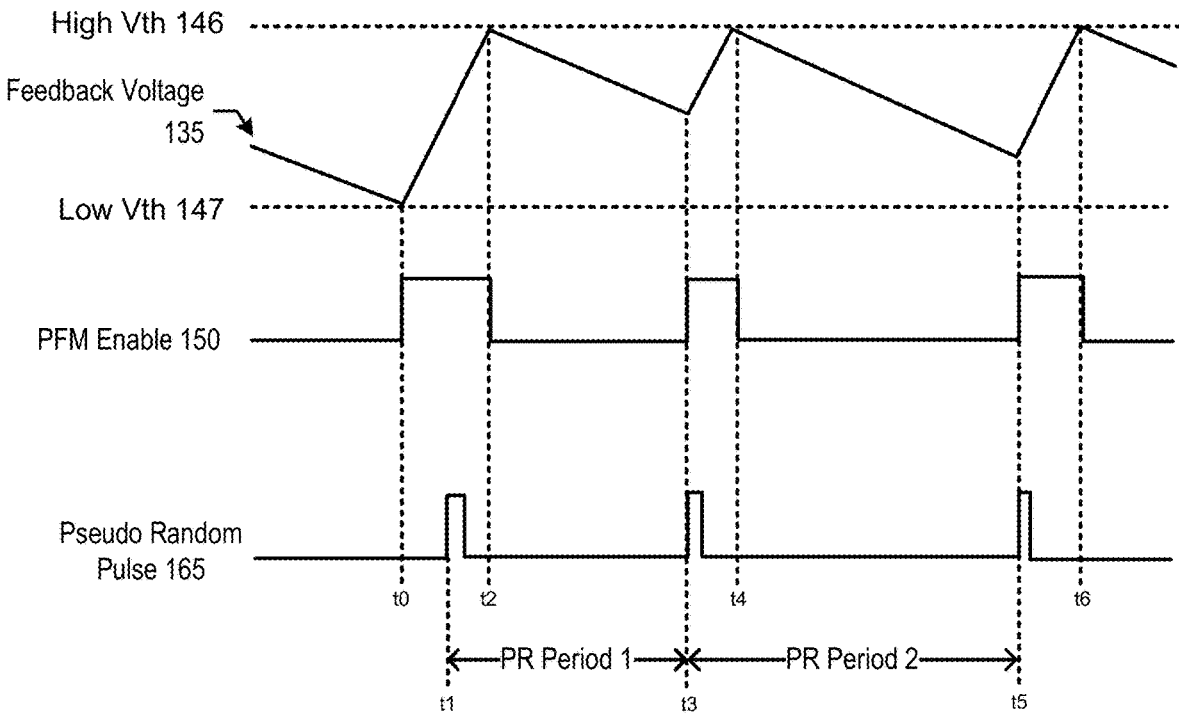
FIG. 3 is a diagram illustrating pseudo random pulses producing pseudo random PFM periods, in accordance with some embodiments of the present disclosure.

FIG. 3 is a diagram illustrating pseudo random pulses producing pseudo random PFM periods, in accordance with some embodiments of the present disclosure. In some embodiments, controller 160 generates a pseudo random number and then computes a pseudo random (PR) period based on the pseudo random number. For example, referring to FIG. 5, controller 160 may compute an average PFM period TS_avg (blocks 510-520), generate a pseudo random number Rn (block 550), and calculate the PR period (block 560) using Rn and Ts_avg with the formula PR period= $(0.2*Ts\_avg)+(Rn*TS\_avg*0.6)$, which generates a PR period between 20% and 80% of the average PFM period.

Prior to time t0, system 100 is in a discharging stage (PFM enable 150 is low). At time t0, feedback voltage 135 reaches low threshold voltage 147 and triggers comparator 140 to raise PFM enable 150 high and enter a charging stage. At time t1, pseudo random pulse 165 turns high but does not change the stage of system 100 because system 100 is already in the charging stage at t0. At time t2, feedback voltage 135 reaches high threshold voltage 146 and system 100 begins the discharging stage.

At time t3, pseudo random pulse 165 turns high, causing PFM enable 150 to turn high and enter the charging stage prior to feedback voltage 135 reaching low threshold voltage. At time t4 feedback voltage 135 reaches high threshold voltage 146, triggering PFM enable 150 to turn low and enter the discharging stage. At time t5, pseudo random pulse 165 turns high, causing PFM enable 150 to turn high and enter the charging stage. As graph 300 shows, pseudo random pulse 165 causes the PFM period to become pseudo random (PR period 1 is a different time duration than PR period 2), which transforms the PFM frequency into a pseudo random frequency (see FIGS. 4A, 4B, and corresponding text for further details).

FIG. 4A is a diagram illustrating system 100 operating with a PFM frequency in the audible frequency range when controller 160 disables pseudo random pulse generation, in accordance with some embodiments of the present disclosure. Diagram 400 shows peaks 410 from system 100 switching at 3 kHz and its corresponding produced harmonics at 6 kHz, 9 kHz, etc. As discussed herein, peaks 410 causes mechanical vibrations in system 100 that, in turn, generates audible sounds.

FIG. 4B is a diagram illustrating system 100 operating with a PFM frequency in the audible frequency range when controller 160 enables pseudo random pulse generation, in accordance with some embodiments of the present disclosure. Diagram 450 shows that peaks 410 are attenuated due to the pseudo-random pulses that cause the PFM period to become pseudo random periods. As such, the pseudo random periods translate to white noise on diagram 450 thereby minimizing mechanical vibrations and corresponding audible noise from system 100.

Figure 5:
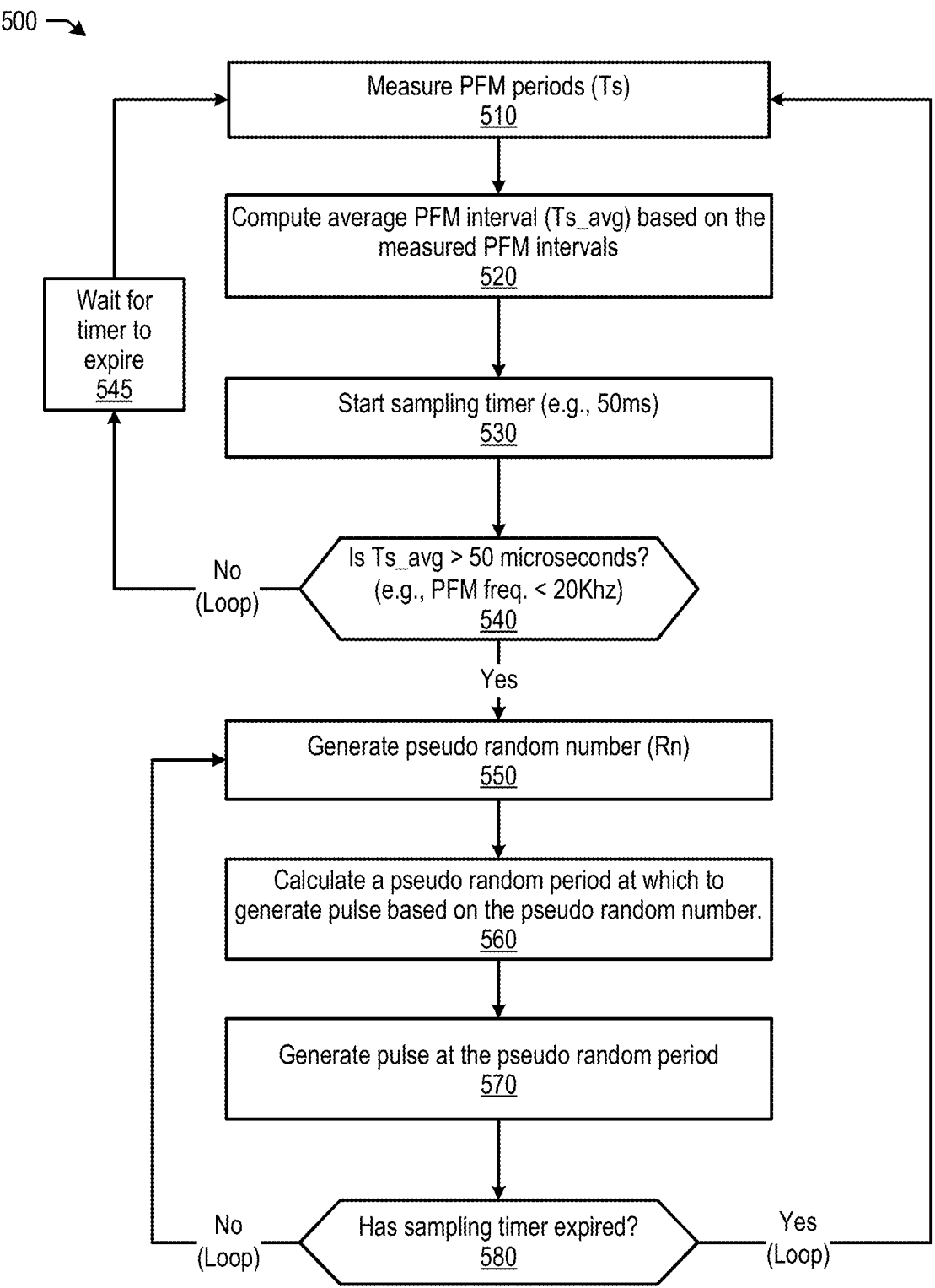
FIG. 5 is a flow diagram of a method for generating a pseudo random pulse and providing the pseudo random pulse to a buck regulator, in accordance with some embodiments of the present disclosure.

FIG. 5 is a flow diagram of a method for generating a pseudo random pulse and providing the pseudo random pulse to a buck regulator, in accordance with some embodiments of the present disclosure. Method 500 may be performed by processing logic that may include hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. In some embodiments, at least a portion of method 500 may be performed by controller 160, device 620 shown in FIGS. 6 and 7, IC controller 2100 shown in FIG. 8, or a combination thereof.

With reference to FIG. 5, method 500 illustrates example functions used by various embodiments. Although specific function blocks ("blocks") are disclosed in method 500, such blocks are examples. That is, embodiments are well suited to performing various other blocks or variations of the blocks recited in method 500. It is appreciated that the blocks in method 500 may be performed in an order different than presented, and that not all of the blocks in method 500 may be performed.

With reference to FIG. 5, method 500 begins at block 510, where processing logic measures PFM periods of the buck regulator. For example, processing logic may detect periods between the beginning of charging stages. At block 520, processing logic computes an average of X consecutive PFM periods. For example, processing logic may sample five PFM periods (e.g., 50 uS, 51 uS, 52 uS, 53 uS, and 54 uS) and compute the average of the PFM periods (e.g., 52 uS).

At block 530, processing logic starts a sampling timer (e.g., 50 ms) to check Ts_avg. At block 540, processing logic determines whether the average PFM period is greater than 50 microseconds, which equates to less than a 20 kHz PFM frequency and in the audible frequency range. If the average period is not greater than 50 microseconds, indicating the PFM frequency is greater than 20 kHz, block 540 branches to no branch, whereupon at block 545, processing logic waits for the sampling timer to expire. Once expired, processing logic loops back to block 510 and repeats blocks 510 through 540.

When the average PFM period is greater than 50 microseconds, indicating that the PFM frequency is in the audible frequency range, processing logic branches to yes branch at block 540, whereupon at block 550, processing logic generates a pseudorandom number (Rn), such as a number between 0 and 1. At block 560, processing logic calculates a pseudo random period at which to generate a pulse based on the random number. In some embodiments, processing logic calculates the pseudo random period based on the average PFM period (Ts_avg). For example, processing logic may compute the pseudo random (PR) period to generate a random pulse based on the formula PR period=

(0.2\*Ts_avg)+(Rn\*TS_avg\*0.6), which generates a random period between 20% and 80% of the average PFM period.

At block 570, processing logic generates the pseudo rando pulse at the pseudo random period and sends pseudo random pulse 165 to OR logic 170, triggering a charging stage in system 100 as discussed herein (see FIGS. 2, 3, and corresponding text for further details). At block 580, processing logic determines whether the sampling timer has expired. In some embodiments, processing logic performs block 580 to reduce processing resources by reusing Ts-avg. If the sampling timer has not expired, processing logic branches to no branch and generates another (different) pseudo random number at block 550. Processing logic then repeats blocks 560 and 570 to generate another pseudo random period and corresponding pseudo random pulse at the other pseudo random period. This looping continues until the sampling timer has expired, at which point processing logic branches to yes branch, which loops back to perform blocks 510 through 540 and determine whether the PFM frequency is still within the audible frequency range (e.g., PFM period is greater than 50 microseconds).

Figure 6:
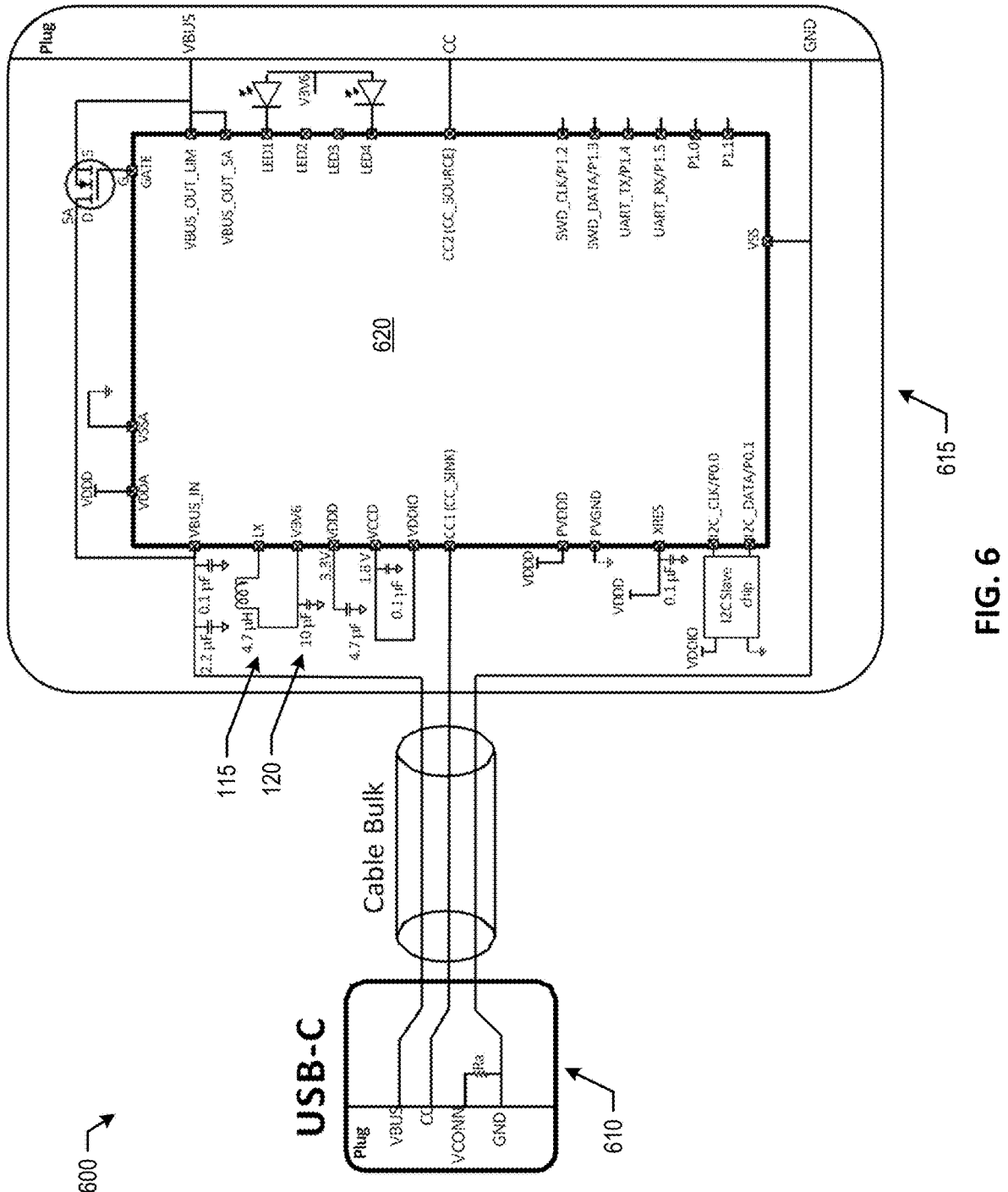
FIG. 6 is a diagram illustrating an example of a system that includes a power management device coupled into a Type-C USB cable, in accordance with some embodiments of the present disclosure.

FIG. 6 is a diagram illustrating an example of a system that includes a power management device coupled into a Type-C USB cable, in accordance with some embodiments of the present disclosure. In some embodiments, system 600 supports 3 A (amp) requirements, 5 A requirements, or a combination thereof. In some embodiments, system 600 supports Extended Power Range (EPR) where the maximum wattage is up to 240 W (48V/5 A). In some embodiments, system 600 is a cable compatible and/or compliant with a USB Type-C™ technology defined in various releases and/or versions of the USB Type-C™ specification (e.g., such as Release 1.0, Release 1.1, etc.). The USB Type-C™ specification defines Type-C™ receptacle, Type-C™ plug, and Type-C™ cables that can support USB communications as well as power delivery over newer USB power delivery protocols defined in various revisions/versions of a Universal Serial Bus Power Delivery (USB-PD) specification. Examples of USB Type-C™ functions and requirements may include, without limitation, data and other communications according to USB 2.0 and USB 3.0/3.1/3.2, electro-mechanical definitions and performance requirements for Type-C™ cables, electro-mechanical definitions and performance requirements for Type-C™ receptacles, electro-mechanical definitions and performance requirements for Type-C™ plugs, requirements for Type-C™ to legacy cable assemblies and adapters, requirements for Type-C™-based device detection and interface configuration, requirements for optimized power delivery for Type-C™ connectors (also referred to as USB-C connectors), etc.

System 600 includes USB-C connector 610 and sub-system 615. Sub-system 615 includes inductor 115 and capacitor 120 (shown in FIG. 1) and power management device 620. Power management device 620, in some embodiments, includes controller 160, OR logic 170, selector switch 145, comparator 140, and other circuit components shown in FIG. 1 (see FIG. 7 and corresponding text for further details).

Figure 7:
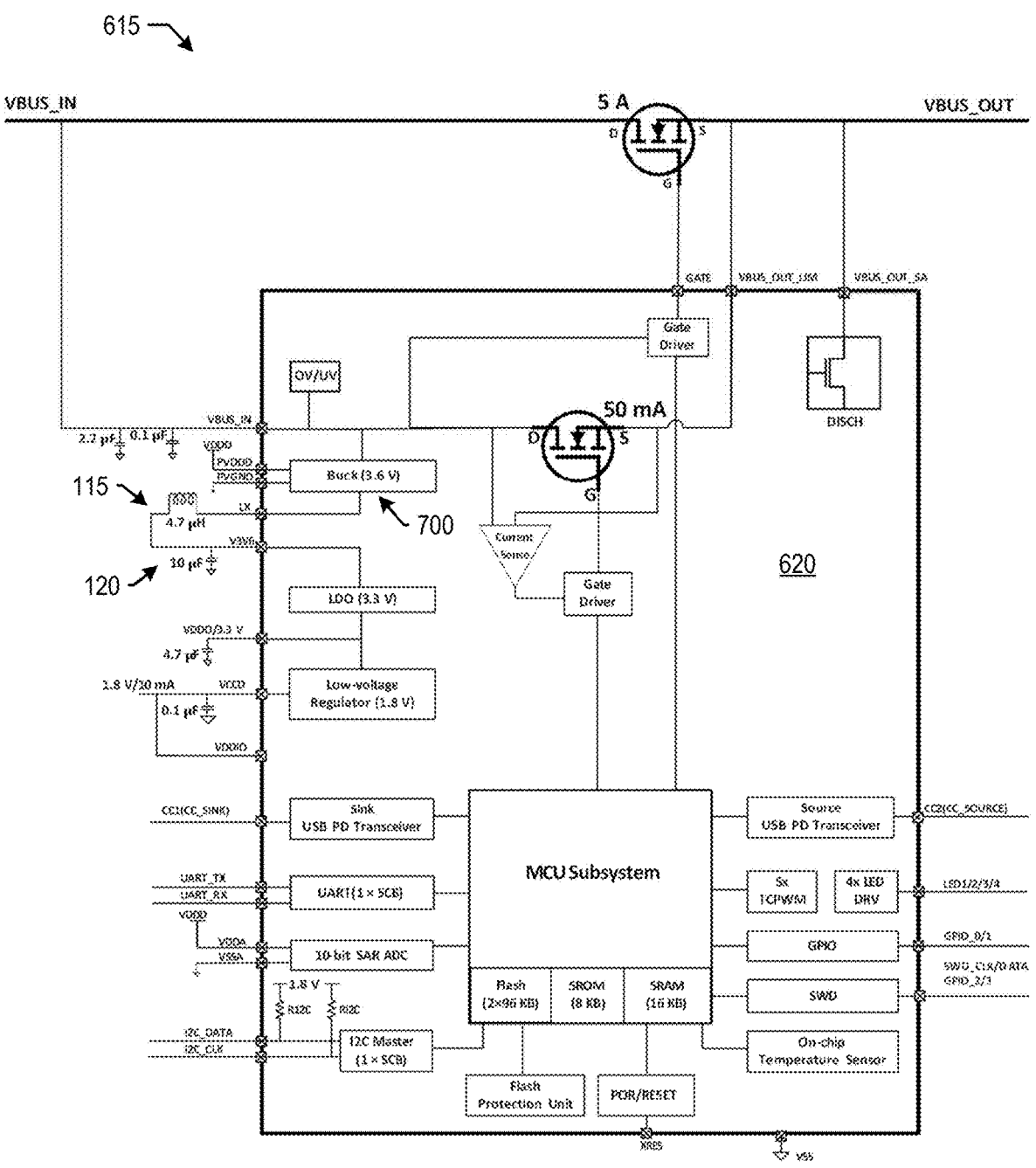
FIG. 7 is a diagram illustrating an example of a power management device, in accordance with some embodiments of the present disclosure.

FIG. 7 is a diagram illustrating an example of a power management device, in accordance with some embodiments of the present disclosure. FIG. 7 shows more detail of power management device 620. As can be seen, power management device 620 includes buck regulator 700, which includes controller 160, OR logic 170, selector switch 145, comparator 140, and the other circuit components shown in FIG. 1. In some embodiments, the power management device is configured to control (and/or otherwise operate in)

a power converter that is compatible and/or compliant with a specific revision and/or version of the USB-PD specification (e.g., such as Revision 1.0, Revision 2.0, Revision 3.0, etc., or later revisions/versions thereof). The USB-PD specification defines a standard protocol designed to enable the maximum functionality of USB-enabled devices by providing more flexible power delivery along with data communications over a single USB Type-C™ cable through USB Type-C™ ports. The USB-PD specification also describes the architecture, protocols, power supply behavior, parameters, and cabling necessary for managing power delivery over USB Type-C™ cables at up to 100 W of power (or higher, if compliant with Extended Power Range (EPR) technology). According to the USB-PD specification, devices with USB Type-C™ ports (e.g., USB-enabled devices) may negotiate for more current and/or higher or lower voltages over a USB Type-C™ cable than are allowed in older USB specifications (e.g., the USB 2.0 Specification, USB 3.1 Specification, the USB Battery Charging Specification Rev. 1.1/1.2, etc.). For example, the USB-PD specification defines the requirements for a PD contract that can be negotiated between a pair of USB-enabled devices. The PD contract can specify both the power level and the direction of power transfer that both devices can accommodate and can be dynamically re-negotiated (e.g., without device un-plugging) upon request by either device and/or in response to various events and conditions, such as power role swap, data role swap, hard reset, failure of the power source, etc.

Figure 8:
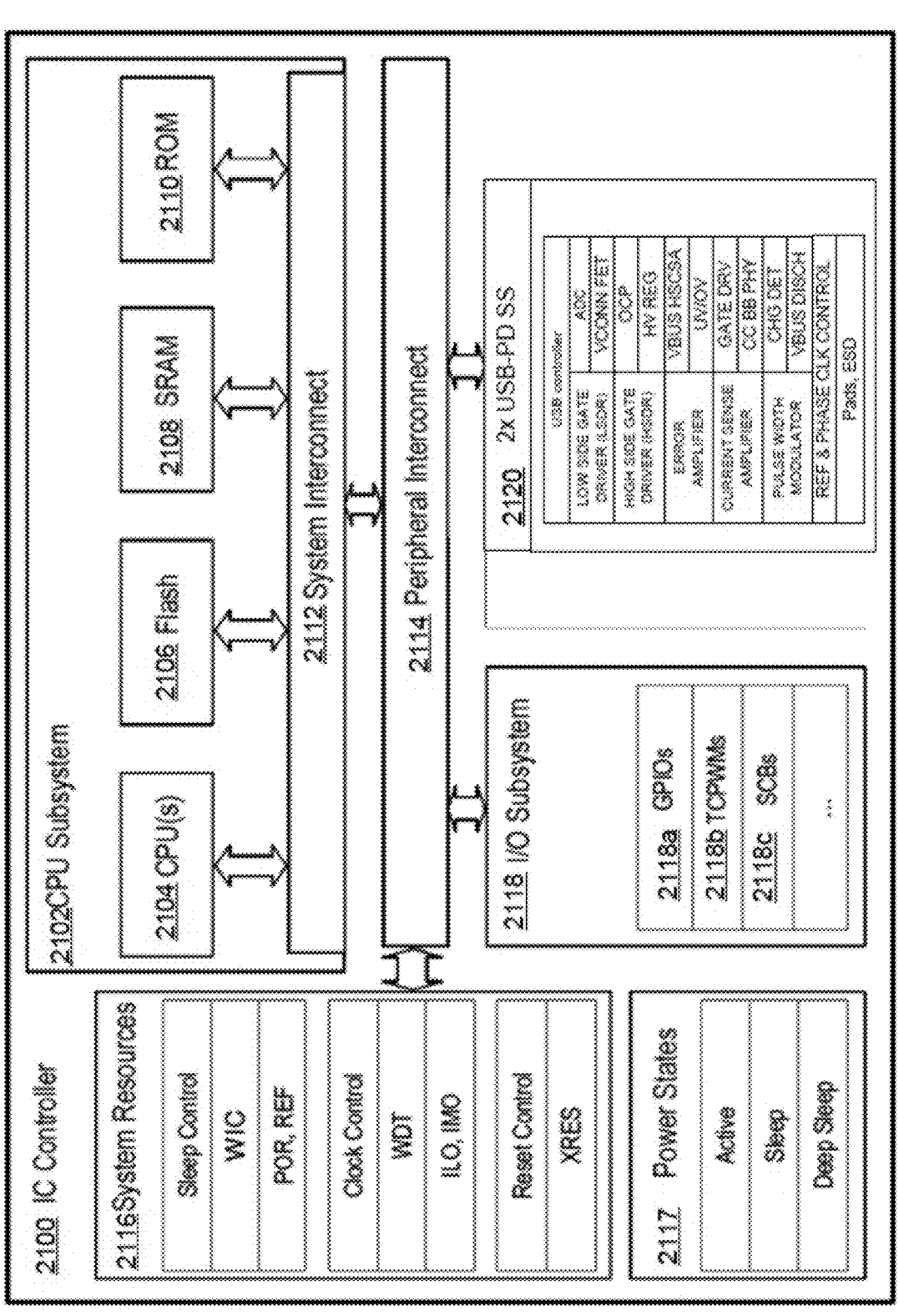
FIG. 8 is a block diagram illustrating an example of an integrated circuit (IC) controller 2100 with a USB-PD subsystem with phased clock generators, in accordance with some embodiments of the present disclosure.

FIG. 8 is a block diagram illustrating an example of an integrated circuit (IC) controller 2100 with a USB-PD subsystem with phased clock generators, in accordance with some embodiments of the present disclosure. IC controller 2100 is example semiconductor device that is configured in accordance with controller 160 and buck regulator circuitry and functionality discussed herein. In the embodiment illustrated in FIG. 8, IC controller 2100 is a single-chip IC controller manufactured on a semiconductor die. In another example, IC controller 2100 may be a single-chip IC that is manufactured as a System-on-Chip (SoC). In other embodiments, the IC controller 2100 may be a multi-chip module encapsulated in a single semiconductor package. Among other components, IC controller 2100 includes central processing unit (CPU) subsystem 2102, system interconnect 2112, peripheral interconnect 2114, system resources 2116, input/output (I/O) subsystem 2118, USB-PD subsystem 2120, and various terminals (e.g., pins) that are configured for receiving and sending signals.

CPU subsystem 2102 includes one or more CPUs 2104, flash memory 2106, SRAM (Static Random Access Memory) 2108, and ROM (Read Only Memory) 2110 that are coupled to system interconnect 2112. CPU 2104 is a suitable processor that can operate in an IC or a SoC device. Flash memory 2106 is non-volatile memory (e.g., NAND flash, NOR flash, etc.) that is configured for storing data, programs, and/or other firmware instructions. Flash memory 2106 is tightly coupled within the CPU subsystem 2102 for improved access times. SRAM 2108 is volatile memory that is configured for storing data and firmware instructions accessed by CPU 2104. ROM 2110 is read-only memory (or other suitable storage medium) that is configured for storing boot-up routines, configuration parameters, and other firmware parameters and settings. System interconnect 2112 is a system bus (e.g., a single-level or multi-level Advanced High-Performance Bus, or AHB) that is configured as an interface that couples the various components of CPU subsystem 2102 to each other, as well as a data and control interface between the various components of the CPU subsystem and peripheral interconnect 2114.

Peripheral interconnect 2114 is a peripheral bus (e.g., a single-level or multi-level AHB) that provides the primary data and control interface between CPU subsystem 2102 and its peripherals and other resources, such as system resources 2116, I/O subsystem 2118, and USB-PD subsystem 2120. The peripheral interconnect 2114 may include various controller circuits (e.g., direct memory access, or DMA controllers), which may be programmed to transfer data between peripheral blocks without burdening the CPU subsystem 2102. In various embodiments, each of the components of the CPU subsystem and the peripheral interconnect may be different with each choice or type of CPU, system bus, and/or peripheral bus.

System resources 2116 include various electronic circuits that support the operation of IC controller 2100 in its various states and modes. For example, system resources 2116 may include a power subsystem having analog and/or digital circuits required for each controller state/mode such as, for example, sleep control circuits, wake-up interrupt controller (WIC), power-on-reset (POR), voltage and/or current reference (REF) circuits, etc. In some embodiments, the power subsystem may also include circuits that allow IC controller 2100 to draw and/or provide power from/to external sources with several different voltage and/or current levels and to support controller operation in several power states 2117 (e.g., such as active state, sleep state, and a deep sleep state with clocks turned off). Further, in some embodiments the CPU subsystem 2102 may be optimized for low-power operation with extensive clock gating and may include various internal controller circuits that allow the CPU to operate in the various power states 2117. For example, the CPU may include a wake-up interrupt controller that is configured to wake the CPU from a sleep state, thereby allowing power to be switched off when the IC chip is in the sleep state. System resources 2116 may also include a clock subsystem having analog and/or digital circuits for clock generation and clock management such as, for example, clock control circuits, watchdog timer (WDT) circuit(s), internal low-speed oscillator (ILO) circuit(s), and internal main oscillator (IMO) circuit(s), etc. System resources 2116 may also include analog and/or digital circuit blocks that provide reset control and support external reset (XRES).

In various embodiments, I/O subsystem 2118 may include various different types of I/O blocks and subsystems. For example, in the embodiment illustrated in FIG. 8, I/O subsystem 2118 includes GPIO (general purpose input output) blocks 2118a, TCPWM (timer/counter/pulse-width-modulation) blocks 2118b, and SCBs (serial communication blocks) 2118c. GPIOs 2118a include analog and/or digital circuits configured to implement various functions such as, for example, pull-ups, pull-downs, input threshold select, input and output buffer enabling/disabling, multiplex signals connected to various I/O pins, etc. TCPWMs 2118b include analog and/or digital circuits configured to implement timers, counters, pulse-width modulators, decoders, and various other analog/mixed signal elements that are configured to operate on input/output signals. SCBs 2118c include analog and/or digital circuits configured to implement various serial communication interfaces such as, for example, I2C, SPI (serial peripheral interface), UART (universal asynchronous receiver/transmitter), CAN (Controller Area Network) interface, CXPI (Clock extension Peripheral Interface), etc.

USB-PD subsystem 2120 provides the interface to a USB Type-C port and is configured to support USB communications as well other USB functionality, such as power delivery and battery charging. USB-PD subsystem 2120 includes the electro-static discharge (ESD) protection circuits required on a Type-C port. USB-PD subsystem 2120 also includes a Type-C transceiver and physical layer logic (PHY), which are configured as an integrated baseband PHY circuit to perform various digital encoding/decoding functions (e.g., Biphase Mark Code-BMC encoding/decoding, cyclical redundancy checks-CRC, etc.) and analog signal processing functions involved in physical layer transmissions. USB-PD subsystem 2120 also provides the termination resistors (RP and RD) and their switches, as required by the USB-PD specification, to implement connection detection, plug orientation detection, and power delivery roles over a Type-C cable. IC controller 2100 (and/or the USB-PD subsystem 2120 thereof) may also be configured to respond to communications defined in a USB-PD Specification such as, for example, SOP (start-of-packet), SOP', and SOP" messaging. USB-PD subsystem 2120 may further include a reference and/or phase clock controller 2101 to generate the reference clock signals and phase-shifted clock signals as described herein.

Among other circuitry, USB-PD subsystem 2120 may further include: one or more analog-to-digital convertors (ADCs) for converting various analog signals to digital signals; a VCONN FET; an error amplifier (ERROR AMP) for controlling the power source voltage applied to the VBUS line per a PD contract; a high voltage regulator (HV REG) for converting the power supply voltage to the precise voltage (e.g., 3-5V) needed to IC controller 2100; a current sense amplifier (CSA) and an over-voltage protection (OVP) circuits for providing over-current (OCP) and over-voltage (OV) protection and under-voltage (UV) protection on the VBUS line with configurable thresholds and response times; a pulse width modulator (PWM); one or more gate drivers (GATE DRV) for controlling the power switches that turn ON and off the provision of power over the VBUS line; a low-side gate driver (LSDR), a high-side gate driver (HSDR) for controlling switches of the buck-boost converter; a communication channel PHY (CC BB PHY) logic for supporting communications on a Type-C Communication Channel (CC) line; a charging protocol detection block (CHG DET) to detect different type of PD chargers; and at least two on-die discharge (VBUS DISCH) circuits that can discharge a VBUS line voltage to any of range of programmable voltage levels.

Unless specifically stated otherwise, terms such as "determining," "generating," "initiating," "capturing," "computing," "providing," "producing," or the like, refer to actions and processes performed or implemented by computing devices that manipulates and transforms data represented as physical (electronic) quantities within the computing device's registers and memories into other data similarly represented as physical quantities within the computing device memories or registers or other such information storage, transmission or display devices. Also, the terms "first," "second," "third," "fourth," etc., as used herein are meant as labels to distinguish among different elements and may not necessarily have an ordinal meaning according to their numerical designation.

Examples described herein also relate to an apparatus for performing the operations described herein. This apparatus may be specially constructed for the required purposes, or it may comprise a general purpose computing device selectively programmed by a computer program stored in the computing device. Such a computer program may be stored in a computer-readable non-transitory storage medium.

The methods and illustrative examples described herein are not inherently related to any particular computer or other apparatus. Various general purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various periods associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. § 112(f) for that unit/circuit/component. Additionally, "configured to" or "configurable to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the present disclosure to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the present disclosure is not to be limited to the details given herein, but may be modified within the scope and equivalents of the appended claims.

What is claimed is:

1. A method comprising:
determining a pulse frequency modulation (PFM) period of a buck regulator, wherein the PFM period comprises a first charging stage and a first discharging stage, and wherein the buck regulator switches from the first discharging stage to the first charging stage based on comparing a feedback voltage to a low threshold voltage;
generating, by a processing device, a pseudo random pulse at a pseudo random period, wherein the pseudo random period is independent from the low threshold voltage; and
initiating a transition from a second discharging stage to a second charging stage based on the pseudo random pulse.

2. The method of claim 1, further comprising:
generating the pseudo random pulse in response to determining that the PFM period corresponds to a PFM frequency within an audible frequency range.

3. The method of claim 1, further comprising:
capturing a plurality of PFM periods of the buck regulator comprising the PFM period;
computing an average PFM period based on the plurality of PFM periods;
generating a pseudo random number; and
computing the pseudo random period based on the pseudo random number and the average PFM period.

4. The method of claim 3, further comprising:
generating a new pseudo random number;
computing a new pseudo random period based on the new pseudo random number and the average PFM period;
generating a new pseudo random pulse based on the new pseudo random period, wherein the new pseudo random period is a different time duration than the pseudo random period; and
initiating a new transition from a third discharging stage to a third charging stage based on the new pseudo random pulse.

5. The method of claim 1, the method further comprising:
providing the pseudo random pulse to a first input of OR logic, wherein the OR logic produces an OR logic output that selects a high threshold voltage as an input to a comparator;

comparing, by the comparator, the high threshold voltage to the feedback voltage; and producing, by the comparator, a comparator output that initiates the transition from the second discharging stage to the second charging stage based comparing the high threshold voltage to the feedback voltage.

6. The method of claim 5, wherein the comparator output feeds to a second input of the OR logic, and wherein the OR logic output selects the low threshold voltage as the input to the comparator when the feedback voltage reaches the high threshold voltage.

7. The method of claim 1, wherein the buck regulator switches from the second discharging stage to the second charging stage prior to the feedback voltage reaching the low threshold voltage.

8. A system comprising:
a processing device; and
a memory to store instructions that, when executed by the processing device cause the system to:
determine a pulse frequency modulation (PFM) period of a buck regulator, wherein the PFM period comprises a first charging stage and a first discharging stage, and wherein the buck regulator switches from the first discharging stage to the first charging stage based on comparing a feedback voltage to a low threshold voltage;
generate a pseudo random pulse at a pseudo random period, wherein the pseudo random period is independent from the low threshold voltage; and
initiate a transition from a second discharging stage to a second charging stage based on the pseudo random pulse.

9. The system of claim 8, wherein the processing device, responsive to executing the instructions, further causes the system to:
generate the pseudo random pulse in response to determining that the PFM period corresponds to a PFM frequency within an audible frequency range.

10. The system of claim 8, wherein the processing device, responsive to executing the instructions, further causes the system to:
capture a plurality of PFM periods of the buck regulator comprising the PFM period;
compute an average PFM period based on the plurality of PFM periods;
generate a pseudo random number; and
compute the pseudo random period based on the pseudo random number and the average PFM period.

11. The system of claim 10, wherein the processing device, responsive to executing the instructions, further causes the system to:
generate a new pseudo random number;
compute a new pseudo random period based on the new pseudo random number and the average PFM period;
generate a new pseudo random pulse based on the new pseudo random period, wherein the new pseudo random period is a different time duration than the pseudo random period; and
initiate a new transition from a third discharging stage to a third charging stage based on the new pseudo random pulse.

12. The system of claim 8, wherein the processing device, responsive to executing the instructions, further causes the system to:

provide the pseudo random pulse to a first input of OR logic, wherein the OR logic produces an OR logic output that selects a high threshold voltage as an input to a comparator;

compare, by the comparator, the high threshold voltage to the feedback voltage; and produce, by the comparator, a comparator output that initiates the transition from the second discharging stage to the second charging stage based comparing the high threshold voltage to the feedback voltage.

13. The system of claim 12, wherein the comparator output feeds to a second input of the OR logic, and wherein the OR logic output selects the low threshold voltage as the input to the comparator when the feedback voltage reaches the high threshold voltage.

14. The system of claim 8, wherein the buck regulator switches from the second discharging stage to the second charging stage prior to the feedback voltage reaching the low threshold voltage.

15. The system of claim 8, wherein the system is a cable compatible with a Universal Serial Bus Type-C (USB Type-C) specification.

16. A power converter, comprising:
a buck regulator; and
controller circuitry, operatively coupled with the buck regulator, configured to:
determine a pulse frequency modulation (PFM) period of the buck regulator, wherein the PFM period comprises a first charging stage and a first discharging stage;
generate a pseudo random pulse at a pseudo random period; and
comparator circuitry to initiate a transition from a second discharging stage to a second charging stage based on the pseudo random pulse.

17. The power converter of claim 16, wherein the controller is further configured to:
generate the pseudo random pulse in response to determining that the PFM period corresponds to a PFM frequency within an audible frequency range.

18. The power converter of claim 16, wherein the controller is further configured to:
capture a plurality of PFM periods of the buck regulator comprising the PFM period;
compute an average PFM period based on the plurality of PFM periods;
generate a pseudo random number; and
compute the pseudo random period based on the pseudo random number and the average PFM period.

19. The power converter of claim 17, wherein the controller is further configured to:
generate a new pseudo random number;
compute a new pseudo random period based on the new pseudo random number and 9
generate a new pseudo random pulse based on the new pseudo random period, wherein the new pseudo random period is a different time duration than the pseudo random period; and
initiate a new transition from a third discharging stage to a third charging stage based on the new pseudo random pulse.

20. The power converter of claim 16, wherein the comparator circuitry further comprises:
OR logic circuitry, wherein the OR logic circuitry is configured to receive the pseudo random pulse at a first input and produce an OR logic output that selects a high threshold voltage; and a comparator configured to:

receive the high threshold voltage as a input;

compare the high threshold voltage to a feedback voltage of the buck regulator; and produce a comparator output that initiates the transition from the second discharging stage to the second charging stage based comparing the high threshold voltage to the feedback voltage.

21. The power converter of claim 20, wherein the comparator output feeds to a second input of the OR logic circuitry, and wherein the OR logic output selects a low threshold voltage as the input to the comparator when the feedback voltage reaches the high threshold voltage.

22. The power converter of claim 16, wherein the power converter is compatible with a Universal Serial Bus Power Delivery (USB-PD) specification.

* * * * *